United States Patent
Zheng et al.

(10) Patent No.: US 7,492,001 B2
(45) Date of Patent: Feb. 17, 2009

(54) HIGH K STACK FOR NON-VOLATILE MEMORY

(75) Inventors: Wei Zheng, Santa Clara, CA (US);
Mark Randolph, San Jose, CA (US);
Hidehiko Shiraiwa, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 168 days.

(21) Appl. No.: 11/086,310

(22) Filed: Mar. 23, 2005

(65) Prior Publication Data

US 2006/0216888 A1     Sep. 28, 2006

(51) Int. Cl.
*H01L 29/788* (2006.01)
*H01L 29/72* (2006.01)

(52) U.S. Cl. ........................ 257/321; 257/315; 257/316; 257/635; 257/E21.208; 257/E21.209; 438/257; 438/258

(58) Field of Classification Search ................ 257/315, 257/321, 635; 438/257, 258
See application file for complete search history.

(56) References Cited

U.S. PATENT DOCUMENTS

| | | | |
|---|---|---|---|
| 5,688,724 A | 11/1997 | Yoon et al. | 438/778 |
| 5,914,895 A | 6/1999 | Jenne | 365/185.08 |
| 6,090,659 A | 7/2000 | Laibowitz et al. | 438/240 |
| 6,163,049 A * | 12/2000 | Bui | 257/321 |
| 6,215,702 B1 | 4/2001 | Derhacobian et al. | |
| 6,407,435 B1 | 6/2002 | Ma et al. | |
| 6,445,030 B1 | 9/2002 | Wu et al. | 257/315 |
| 6,559,014 B1 | 5/2003 | Jeon | |
| 6,562,491 B1 | 5/2003 | Jeon | |
| 6,617,639 B1 | 9/2003 | Wang et al. | 257/324 |
| 6,642,573 B1 * | 11/2003 | Halliyal et al. | 257/316 |
| 6,693,004 B1 * | 2/2004 | Halliyal et al. | 438/240 |
| 6,744,675 B1 | 6/2004 | Zheng et al. | |
| 6,750,066 B1 | 6/2004 | Cheung et al. | |
| 6,753,570 B1 | 6/2004 | Tripsas et al. | |
| 6,760,270 B2 | 7/2004 | Chindalore et al. | |
| 6,768,160 B1 | 7/2004 | Li et al. | |
| 6,797,599 B2 | 9/2004 | Visokay et al. | |
| 6,812,517 B2 * | 11/2004 | Baker | 257/315 |
| 6,894,932 B1 | 5/2005 | Melik-Martirosian et al. | 365/185.28 |
| 6,902,969 B2 * | 6/2005 | Adetutu et al. | 438/199 |
| 6,939,767 B2 * | 9/2005 | Hoefler et al. | 438/267 |

(Continued)

OTHER PUBLICATIONS

Co-pending U.S. Appl. No. 11/008,233, filed Dec. 10, 2004; entitled: "Memory Cell Having Enhanced High-K Dielectric", by Joong Jeon et al., 30 pages.

(Continued)

*Primary Examiner*—Dao H Nguyen
(74) *Attorney, Agent, or Firm*—Harrity & Harrity, LLP

(57) ABSTRACT

A memory device may include a source region and a drain region formed in a substrate and a channel region formed in the substrate between the source and drain regions. The memory device may further include a first oxide layer formed over the channel region, the first oxide layer having a first dielectric constant, and a charge storage layer formed upon the first oxide layer. The memory device may further include a second oxide layer formed upon the charge storage layer, a layer of dielectric material formed upon the second oxide layer, the dielectric material having a second dielectric constant that is greater than the first dielectric constant, and a gate electrode formed upon the layer of dielectric material.

8 Claims, 7 Drawing Sheets

U.S. PATENT DOCUMENTS

| | | | | |
|---|---|---|---|---|
| 7,005,695 | B1 | 2/2006 | Agarwal | 257/310 |
| 7,034,356 | B2 | 4/2006 | Nomoto et al. | |
| 7,071,538 | B1 * | 7/2006 | Shiraiwa et al. | 257/635 |
| 2002/0024092 | A1 | 2/2002 | Palm et al. | |
| 2002/0090808 | A1 | 7/2002 | Jeon et al. | 438/622 |
| 2003/0045082 | A1 | 3/2003 | Eldridge et al. | 438/593 |
| 2003/0062567 | A1 | 4/2003 | Zheng et al. | 257/316 |
| 2003/0122204 | A1 | 7/2003 | Nomoto et al. | 257/406 |
| 2004/0028952 | A1 | 2/2004 | Cartier et al. | |
| 2005/0006696 | A1 | 1/2005 | Noguchi et al. | 257/316 |
| 2005/0036391 | A1 | 2/2005 | Tomiie et al. | 365/232 |
| 2006/0003529 | A1 | 1/2006 | Baker | 438/258 |
| 2006/0160303 | A1 | 7/2006 | Ang et al. | |

OTHER PUBLICATIONS

Co-pending U.S. Appl. No. 11/049,855, filed Feb. 4, 2005; entitled: "Non-Volatile Memory Device With Improved Erase Speed", by Joong Jeon et al., 22 pages.

Co-pending U.S. Appl. No. 11/128,392, filed May 13, 2005; entitled: "SONOS Memory Cell Having a Graded High-K Dielectric", by Takashi Whitney Orimoto et al., 31 pages.

Co-pending U.S. Appl. No. 11/196,434, filed Aug. 4, 2005; entitled: "SONOS Memory Cell Having High-K Dielectric", by Takashi Whitney Orimoto et al., 27 pages.

* cited by examiner

HIGH K STACK FOR NON-VOLATILE MEMORY

TECHNICAL FIELD

The present invention relates generally to semiconductor devices and, more particularly, to the use of a high dielectric constant (K) stack in a non-volatile memory semiconductor device.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically.

Product development efforts in EEPROM device technology have focused on increasing the programming speed, lowering programming and reading voltages, increasing data retention time, reducing cell erasure times and reducing cell dimensions. One conventional structure used for fabricating an EEPROM device is an oxide-nitride-oxide (ONO) structure. One EEPROM device that utilizes the ONO structure is a silicon-oxide-nitride-oxide-silicon (SONOS) type device. In a SONOS type device, an ONO stack is formed on a silicon substrate. A silicon control gate is then formed over the ONO stack. Another EEPROM device that utilizes the ONO structure is a floating gate FLASH memory device, in which the ONO structure is formed over the floating gate, typically a polysilicon floating gate.

In SONOS devices, during programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon oxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Typically, in a SONOS type device, band-to-band tunneling hot hole injection (BTBHH) is used for discharging the gate. BTBHH injection, however, causes damage to the bottom oxide layer of the ONO structure. Over time, BTBHH-induced damage to the bottom oxide layer leads to data retention problems in the memory device and impairs the device's overall performance and reliability.

DISCLOSURE OF THE INVENTION

Consistent with aspects of the invention, a layer of dielectric material having a high dielectric constant may be formed over a top oxide layer in a semiconductor device, such as, for example, a non-volatile memory. The top oxide layer may be formed over a charge trapping layer that is further formed upon a bottom oxide layer. The dielectric constant of the layer of dielectric material may be greater than a dielectric constant of the bottom oxide layer. A gate electrode may be formed over the layer of high K dielectric material. Use of the layer of high K dielectric material facilitates channel erase in the semiconductor device which causes less damage to the bottom oxide layer, resulting in less charge loss and greater data retention reliability.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a structure for use in a semiconductor device. The structure may include a first oxide layer having a first dielectric constant, a charge storage layer formed upon the first oxide layer, and a second oxide layer formed upon the charge storage layer. The structure may further include a layer of dielectric material formed on the second oxide layer, the dielectric material having a second dielectric constant greater than the first dielectric constant. The structure may also include a gate electrode formed upon the layer of dielectric material According to another aspect of the invention, a memory device may include a source region and a drain region formed in a substrate and a channel region formed in the substrate between the source and drain regions. The memory device may further include a first oxide layer formed over the channel region, the first oxide layer having a first dielectric constant, a charge storage layer formed upon the first oxide layer, and a second oxide layer formed upon the charge storage layer. The memory device may also include a layer of dielectric material formed upon the second oxide layer, the layer of dielectric material having a second dielectric constant that is greater than the first dielectric constant, and a gate electrode formed upon the layer of dielectric material.

According to a further aspect of the invention, a method of forming a high dielectric constant structure for a semiconductor device includes forming a first oxide layer upon a substrate, where the first oxide layer has a first dielectric constant, and forming a charge storage layer upon the first oxide layer. The method may further include forming a second oxide layer upon the charge storage layer and forming a layer of dielectric material upon the second oxide layer, where the layer of dielectric material has a second dielectric constant that is greater than the first dielectric constant. The method may also include forming a gate electrode upon the layer of dielectric material.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
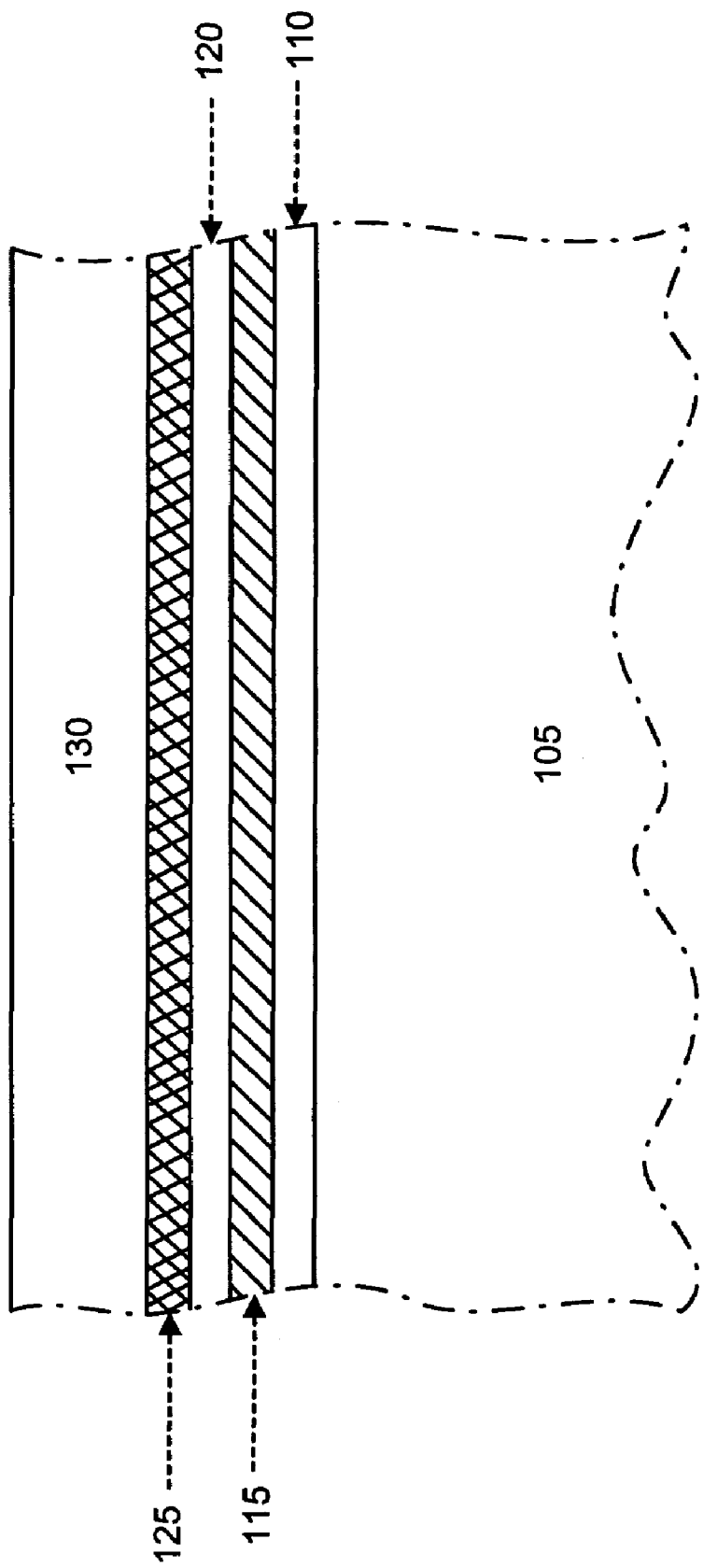
FIG. 1 illustrates the formation of a high-K layer of dielectric material upon a top oxide layer in a layered stack of a semiconductor device consistent with an aspect of the invention.

FIG. 1 illustrates a cross-section of a semiconductor substrate 105 according to an exemplary embodiment of the invention. Substrate 105, consistent with one aspect, may include a crystal silicon wafer. In other implementations, substrate 105 may include a gallium arsenide layer, a silicon-on-insulator structure, a germanium layer, a silicon-germanium layer, or other conventional materials used to form a semiconductor substrate. A bottom oxide layer 110 may be formed on substrate 105. Bottom oxide layer 110 may be formed on substrate 105 using, for example, existing deposition processes, such as a chemical vapor deposition (CVD) process. Bottom oxide layer 110 may include oxide materials, such as, for example, silicon oxide (i.e., $SiO_2$), or silicon oxynitride. The thickness of bottom oxide layer 110 may range, for example, from about 30 Å to about 100 Å.

A charge storage layer 115 may be formed on bottom oxide layer 110 using, for example, existing deposition processes, such as conventional CVD processes. In one exemplary embodiment, charge storage layer 115 may include a nitride charge storage layer, such as, for example, silicon nitride ($Si_3N_4$). In other embodiments, charge storage layer 115 may include other known dielectric materials that may be used to store a charge. The thickness of charge storage layer 115 may range, for example, from about 40 Å to about 100 Å. In other embodiments, charge storage layer 115 may include a conductive material, such as polycrystalline silicon, used to form a floating gate electrode.

A top oxide layer 120 may be formed on charge storage layer 115. Top oxide layer 120 may be formed on charge storage layer 115 using, for example, existing deposition processes, such as a CVD process. Top oxide layer 120 may include oxide materials, such as, for example, silicon oxide, or silicon oxynitride. The thickness of top oxide layer 120 may range, for example, from about 30 Å to about 100 Å.

A high dielectric constant (K) layer 125 of material may be formed on top oxide layer 120. Layer 125 may be formed on top oxide layer 120 using, for example, existing deposition processes, such as a CVD process. High K layer 125 may include a dielectric material that has a higher dielectric constant than the dielectric constant associated with the material of bottom oxide layer 110. In some implementations, high K layer 125 may include a dielectric material having a dielectric constant approximately greater than 7.0. High K layer 125 may include, for example, alumina oxide, hafnium oxide, hafnium aluminate, or hafnium silicate. The thickness of high K layer 125 may range, for example, from about 40 Å to about 200 Å.

A gate electrode layer 130 may be formed on high K layer 125 using existing deposition processes. Gate electrode layer 130 may include, for example, polysilicon, or a metal such as TaN or TiN.

Figure 2:
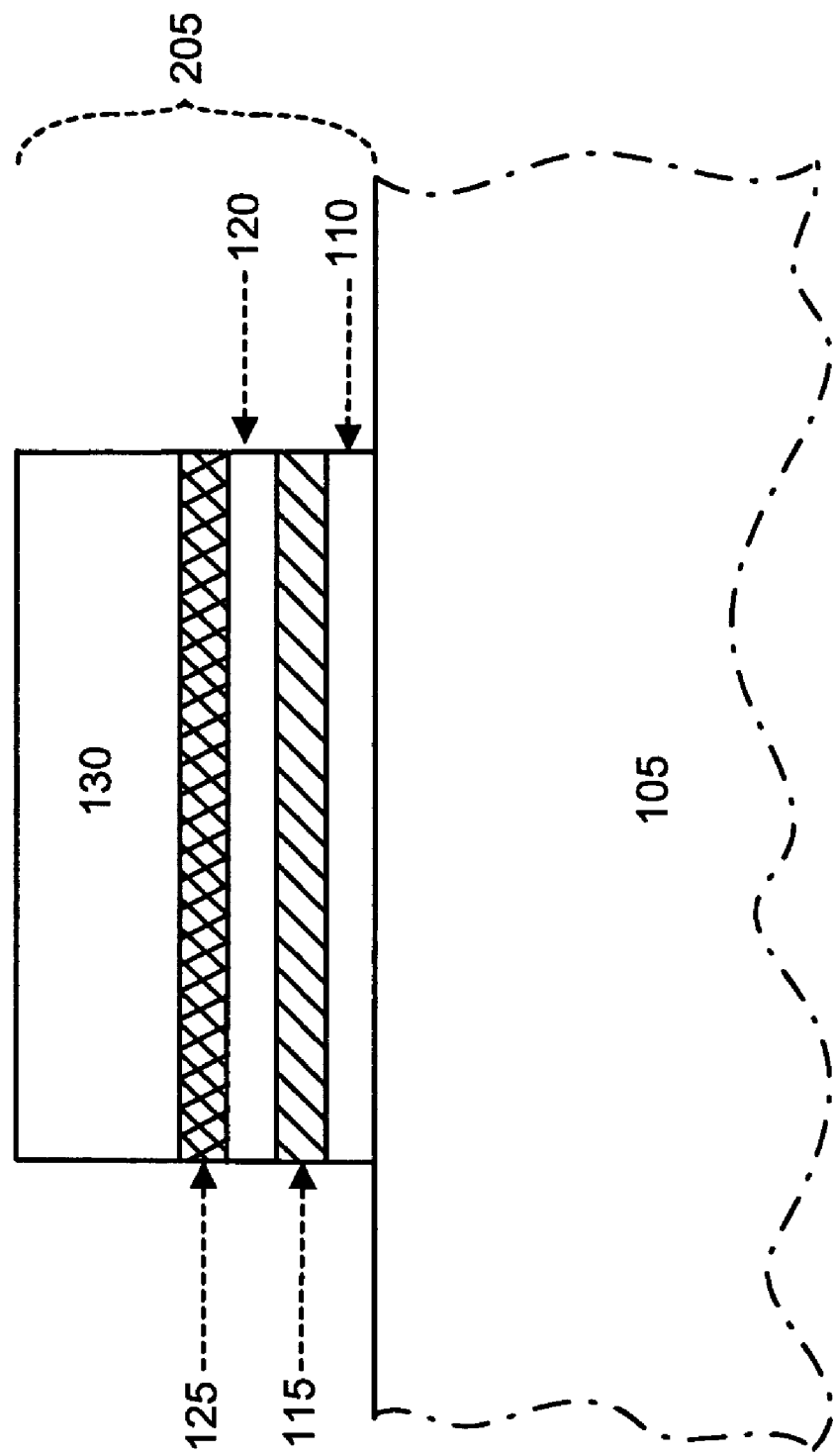
FIG. 2 illustrates etching of the layers of FIG. 1 to produce a gate structure consistent with an aspect of the invention.
Figure 3:
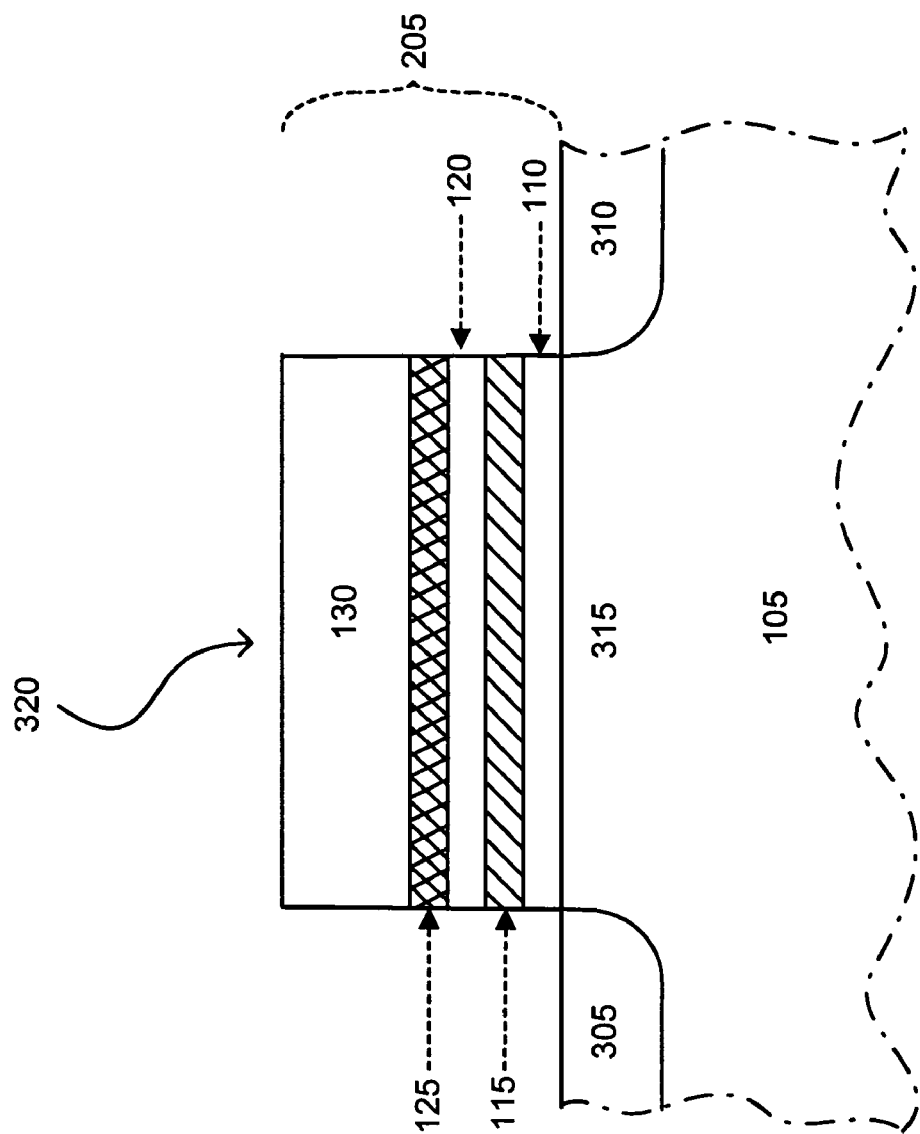
FIG. 3 illustrates the formation of source and drain regions adjacent the gate structure of FIG. 2 consistent with an aspect of the invention.

As shown in FIG. 2, layers 110, 115, 120, 125 and 130 may, in one exemplary embodiment, be etched, using existing photolithographic and etching processes, to form a gate structure 205. A source region 305 and a drain region 310 may then be formed in substrate 105, as shown in FIG. 3, to form a device 320, such as a SONOS type memory device. Source region 305 and drain region 310 may be doped with n-type or p-type impurities based on particular end device requirements. The particular implantation dosages and energy used to implant the impurities is not described herein in order not to unduly obscure the thrust of the invention. One of ordinary skill in the art, however, would be able to optimize the formation of source region 305 and drain region 310 based on the particular end device requirements. Formation of source region 305 and drain region 310 creates a channel region 315 in substrate 105 between the source region 305 and drain region 310.

Figure 4A:
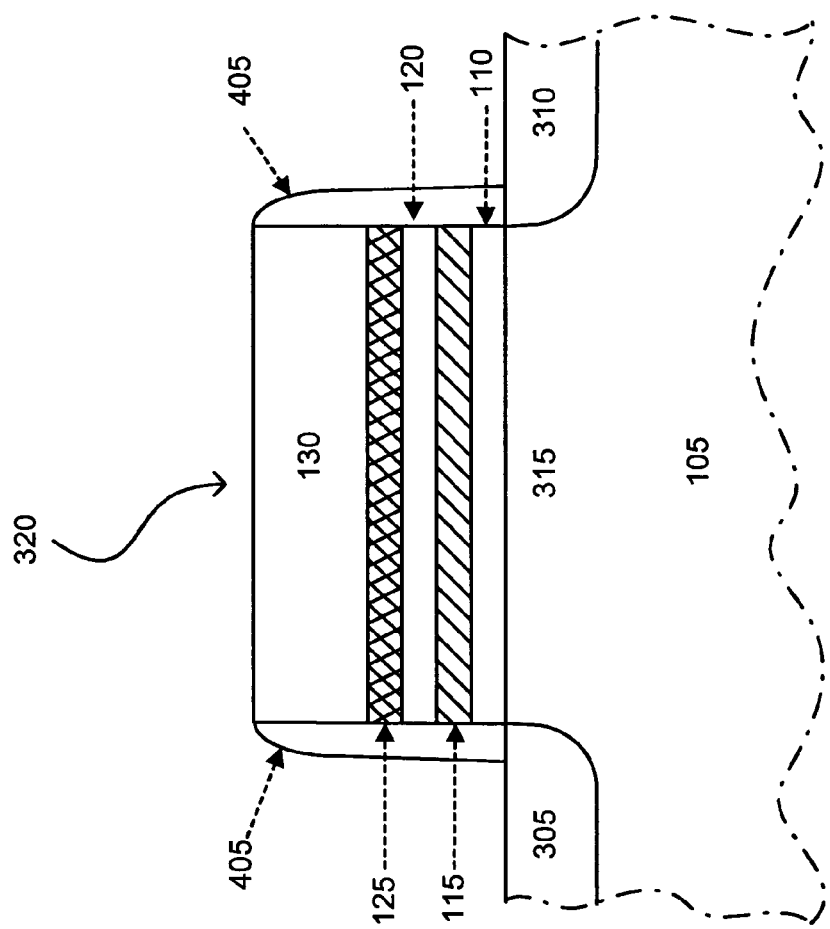
FIGS. 4A & 4B illustrate the formation of spacers adjacent the sidewalls of the gate structure of FIG. 3 consistent with an aspect of the invention.
Figure 4B:
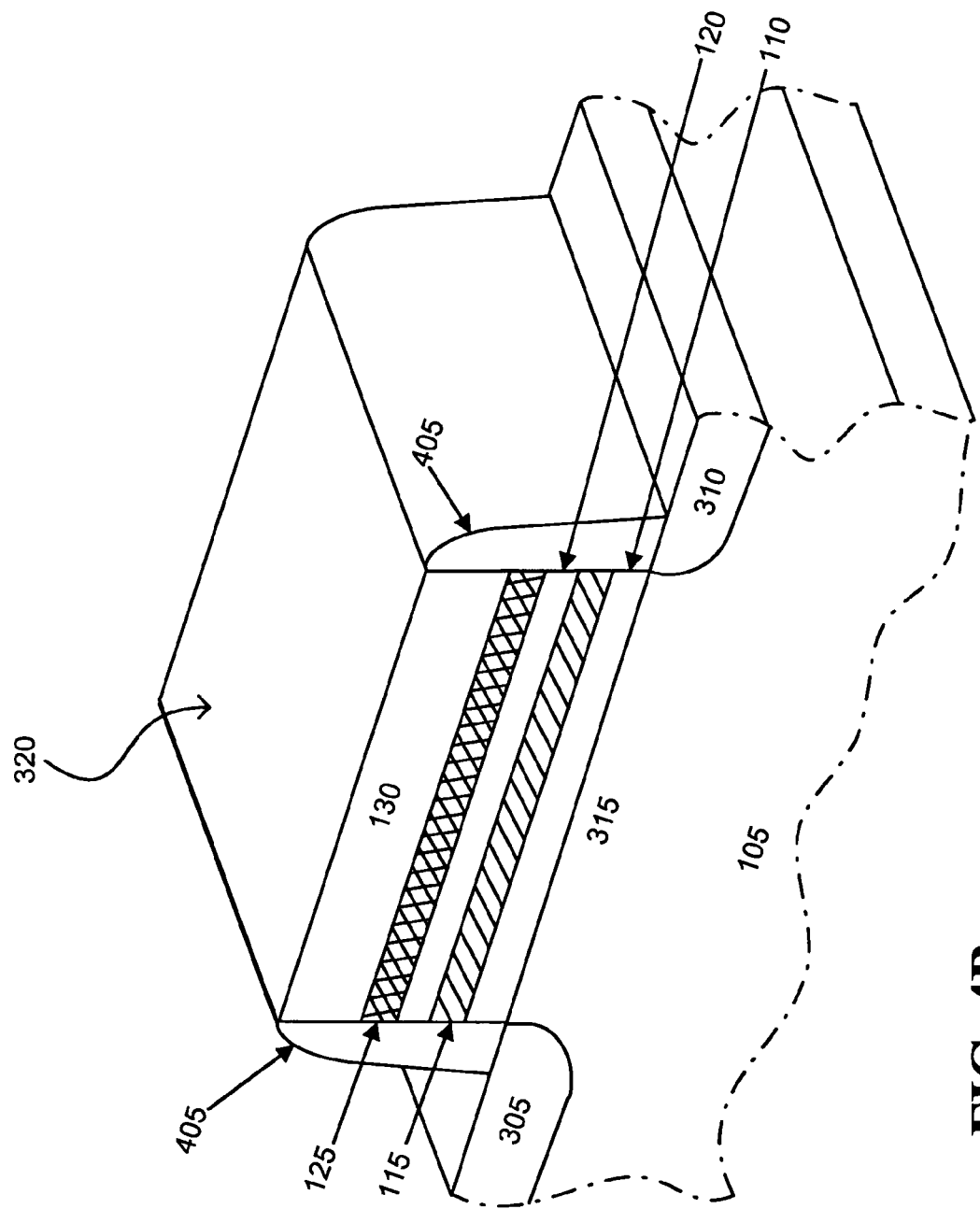

In some implementations, sidewall spacers 405 may then be formed adjacent the vertical side surfaces of gate structure 205, as shown in FIGS. 4A and 4B. Spacers 405 may be formed of a dielectric material such as silicon oxide or silicon nitride. Spacers 405 may function to electrically isolate cells of a subsequently formed memory device from each other. The width and height of spacers 405 may be optimized based on the end device requirements. In other exemplary embodiments, device 320 may be formed with planar structures, without sidewall spacers 405, where layers of the device 320 may extend continuously. In such embodiments, source and drain regions may be formed with implants going through the dielectric layers.

Figure 5A:
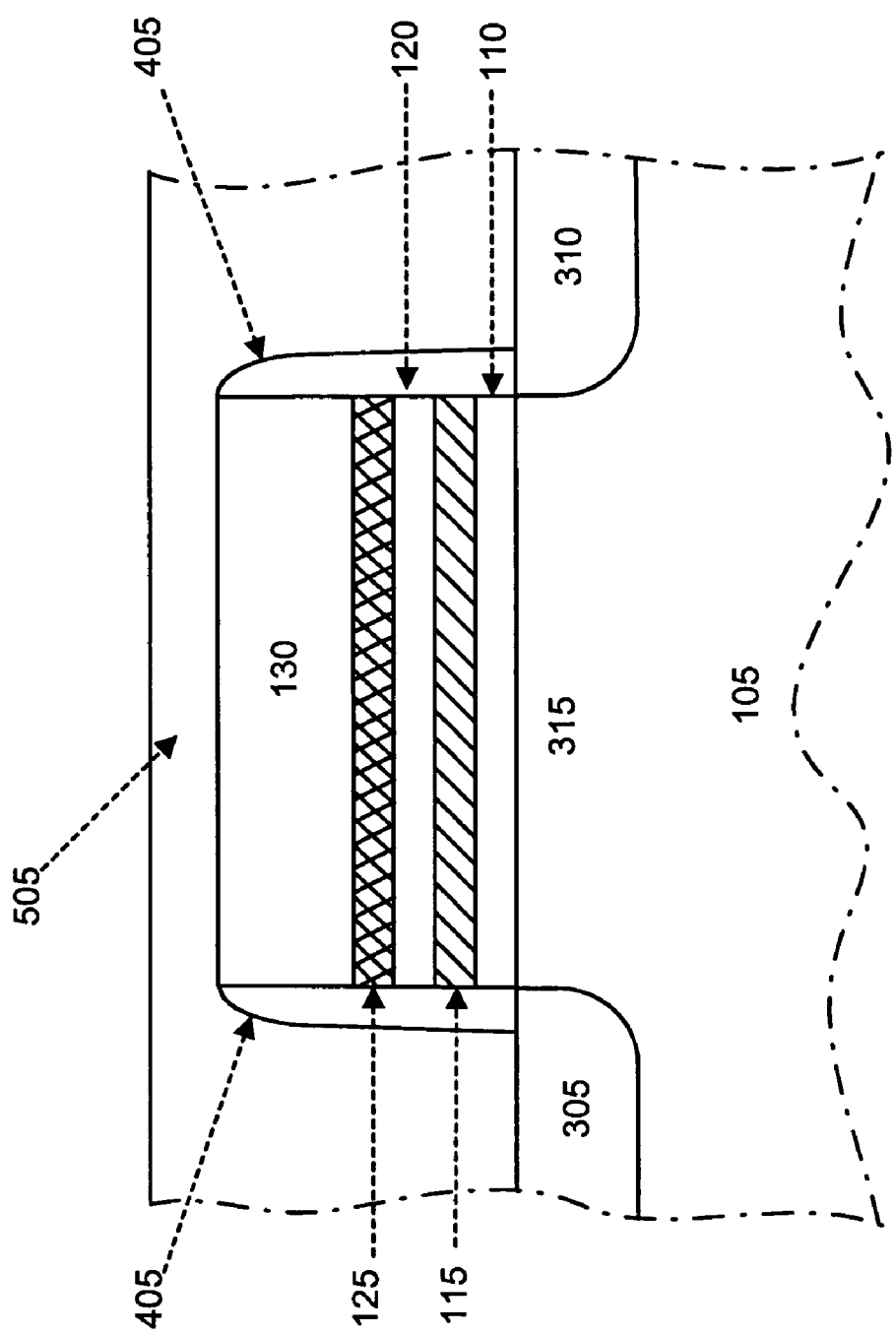
FIGS. 5A & 5B illustrate the formation of an interlayer dielectric over the gate structure of FIG. 3 consistent with an aspect of the invention.
Figure 5B:
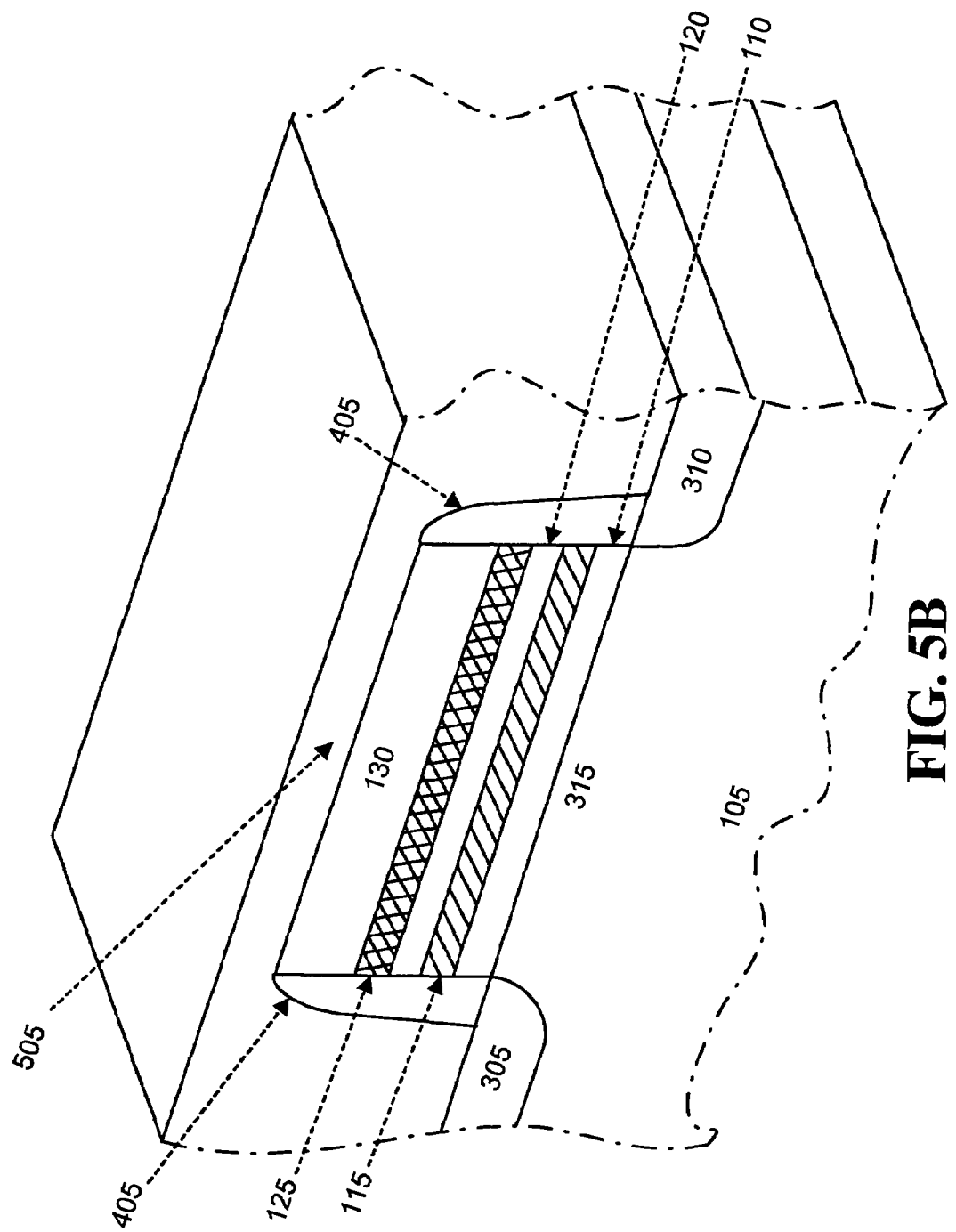

As shown in FIGS. 5A and 5B, an interlayer dielectric (ILD) 505 may be formed over device 320. ILD 505 may be formed over device 320 using, for example, existing deposition processes. ILD 505 may include, for example, tetraethylorthosilicate (TEOS), or any other dielectric material. In one exemplary implementation, ILD 505 may include a borophosphorous TEOS (BPTEOS). The thickness of ILD 505 may vary based on the size of device 320, or based on other design or fabrication parameters. In one exemplary embodiment, the thickness of ILD 505 may range from about 5000 Å to about 15000 Å. ILD 505 may be polished back to a planar surface using, for example, an existing chemical-mechanical polishing (CMP) process. A via (not shown) may then be formed in ILD 505, followed by deposition of a metal, such as copper or aluminum, to form a contact. An interconnect structure may then be formed to interconnect different components of device 320, or to interconnect device 320 with other devices (not shown).

In an exemplary implementation, device 320 illustrated in FIGS. 5A and 5B may represent a single memory cell in a non-volatile memory device. During operation of device 320, voltages may be applied to gate electrode 130, source region 305 and drain region 310. The applied voltages may cause electrical charge from source region 305 and drain region 310 to propagate across channel region 315 and to tunnel from channel region 315 through bottom oxide layer 110 for retention in charge storage layer 115. The layered stack structure 205 that includes bottom oxide layer 110, charge storage layer 115, top oxide layer 120 and high K dielectric layer 125 permits channel erase in device 320, where charge in gate electrode 130 may be discharged via channel region 315.

Conventionally, a SONOS-type nitride based FLASH memory device may be channel erased with direct tunneling of holes into nitride trapping layers. However, this type of device requires a very thin bottom oxide layer, typically less than 30 Å thick. Due to its thin bottom oxide layer, the data retention of this type of device is relatively poor. To improve data retention, nitride based memories with thicker bottom oxides have conventionally been designed. However, the only way to erase such devices is via BTBHH injection, which causes damage to the bottom oxide layer. Damage to the bottom oxide layer, in turn, causes charge loss, resulting in reduced data retention reliability. Use of high K layer 125 in device 320 facilitates channel erase that is less damaging to bottom oxide layer 110 than BTBHH erase, thus, causing less charge loss and increasing data retention reliability. Use of high K layer 125 also reduces the electric field within structure 205, thus, inhibiting gate injection. Due to its ability to perform channel erase, device 320 may, in some implementations, be used in a NAND or NOR architecture.

In an exemplary implementation consistent with the invention, memory device 320, as illustrated in FIG. 4B, may include a single memory cell that may be configured to store two bits of data. That is, charge storage layer 115 may be programmed to store two separate bits of data by localizing the first and second charges to the respective left and right sides of charge storage layer 115 illustrated in FIG. 4B. For example, each of the two bits of memory device 320 may be programmed independently by, for example, channel hot electron injection, to store a bit on each respective side of the charge storage layer 115. In this manner, the charges in charge storage layer 115 become effectively trapped on each respective side of charge storage layer 115. During erasing, the bits stored in charge storage layer 115 may tunnel through bottom oxide layer 110 into the source region 305 and drain region 310, respectively.

In this manner, the density of an array of multiple memory devices 320 may be increased as compared to conventional memory devices that store only one bit of data per cell. In alternative implementations, each memory device 320 may be configured to store one bit of data per memory device 320.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

The foregoing description of embodiments of the present invention provides illustration and description, but is not intended to be exhaustive or to limit the invention to the precise form disclosed. Modifications and variations are possible in light of the above teachings or may be acquired from practice of the invention. For example, while series of acts have been described above, the order of the acts may vary in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein. No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the following claims and their equivalents.

What is claimed is:

1. A structure for use in a semiconductor device, comprising:
   a substrate;
   source, drain and channel regions formed within the substrate;
   a first oxide layer having a first dielectric constant formed over the source, drain, and channel regions of the substrate;
   a charge storage layer formed upon the first oxide layer, wherein the charge storage layer is configured to store two bits of information;
   a second oxide layer formed upon the charge storage layer and having a thickness ranging from about 30 Å to about 100 Å;
   a single layer comprising one dielectric material formed directly on the second oxide layer, the one dielectric material having a second dielectric constant greater than the first dielectric constant and where the second dielectric constant is greater than 7.0,
   wherein the one dielectric material comprises hafnium aluminate, and
   wherein a thickness of the single layer comprising the one dielectric material ranges from about 40 Å to about 200 Å; and
   a gate electrode formed directly upon the single layer comprising one dielectric material.

2. The structure of claim 1, wherein the charge storage layer comprises a nitride.

3. The structure of claim 1, wherein the substrate comprises silicon.

4. The structure of claim 1, wherein the second oxide layer comprises one of silicon oxide or silicon oxynitride.

5. A memory device, comprising:
   a source region and a drain region formed in a substrate;
   a channel region formed in the substrate between the source and drain regions;
   a first oxide layer formed over the channel region, the first oxide layer having a first dielectric constant;
   a charge storage layer formed upon the first oxide layer, wherein the charge storage layer is configured to store two bits of information;
   a second oxide layer formed upon the charge storage layer and having a thickness ranging from about 30 Å to about 100 Å;
   a single layer comprising one dielectric material formed directly upon the second oxide layer, the one dielectric material having a second dielectric constant that is greater than the first dielectric constant, where the second dielectric constant is greater than 7.0, wherein the one dielectric material comprises hafnium aluminate, wherein a thickness of the single layer comprising one dielectric material ranges from about 40 Å to about 200 Å; and a gate electrode formed upon the single layer comprising one dielectric material.

6. The memory device of claim 5, wherein the second oxide layer comprises one of silicon oxide or silicon oxynitride.

7. The memory device of claim 5, wherein the combined thickness of the second oxide layer and the single layer comprising one dielectric material ranges from about 70 Å to about 300 Å.

8. A structure for use in a semiconductor device, comprising:

a first oxide layer having a first dielectric constant;

a charge storage layer formed upon the first oxide layer;

a second oxide layer formed upon the charge storage layer and having a thickness ranging from about 30 Å to about 100 Å;

a single layer comprising one dielectric material formed directly on the second oxide layer, the one dielectric material having a second dielectric constant greater than the first dielectric constant and where the one dielectric material comprises hafnium aluminate, wherein a thickness of the single layer comprising one dielectric material ranges from about 40 Å to about 200 Å; and a gate electrode formed directly upon the single layer.

\* \* \* \* \*